(12) United States Patent
Miyakoshi

(10) Patent No.: US 7,645,411 B2
(45) Date of Patent: Jan. 12, 2010

(54) IMPRINTING APPARATUS AND METHOD

(75) Inventor: Hiroshi Miyakoshi, Hino (JP)

(73) Assignee: Konica Minolta Holdings, Inc., Tokyo (JP)

( * ) Notice: Subject to any disclaimer, the term of this patent is extended or adjusted under 35 U.S.C. 154(b) by 37 days.

(21) Appl. No.: 11/600,187

(22) Filed: Nov. 16, 2006

(65) Prior Publication Data

US 2007/0114696 A1 May 24, 2007

(30) Foreign Application Priority Data

Nov. 22, 2005 (JP) ............................. 2005-336844
Sep. 29, 2006 (JP) ............................. 2006-266238

(51) Int. Cl.
*B28B 3/06* (2006.01)
*B29C 59/00* (2006.01)
*H01L 27/00* (2006.01)
*B30B 15/20* (2006.01)

(52) U.S. Cl. ....................... 264/319; 264/293; 977/887; 425/385; 425/443

(58) Field of Classification Search ................. 264/293, 264/40.5, 319; 977/887; 425/385, 443
See application file for complete search history.

(56) References Cited

U.S. PATENT DOCUMENTS

| | | | |
|---|---|---|---|
| 3,106,888 A * | 10/1963 | Chapleau | 100/232 |
| 4,590,784 A * | 5/1986 | Okabe et al. | 72/389.3 |
| 6,758,664 B1 | 7/2004 | Curtiss et al. | |
| 2003/0146526 A1 | 8/2003 | Mead et al. | |
| 2003/0170053 A1 | 9/2003 | Montelius et al. | |
| 2005/0212154 A1 | 9/2005 | Inoue et al. | |
| 2007/0148653 A1 | 6/2007 | Yoshida | |

FOREIGN PATENT DOCUMENTS

| | | |
|---|---|---|
| DE | 102 33 462 A1 | 2/2004 |
| JP | 2001-179750 | 7/2001 |
| JP | 2002-137229 | 5/2002 |
| JP | 2005-189128 | 7/2005 |
| JP | 2005-199455 | 7/2005 |
| WO | WO 2004/024416 A1 | 3/2004 |

OTHER PUBLICATIONS

Wang, Jing, Vertical Polymer Tunneling Sensor Platforms by Hot Embossing Technique, Ph.D. Dissertation, College of Engineering and Science, Louisiana Tech University, May 2003, 100 pages.*
Colburn et al., Step and flash imprint lighography: a new approach to high-resolution patterning, Proceedings of SPIE, vol. 3676, Emerging Lithographic Technologies III (1999), pp. 379-389.*

(Continued)

*Primary Examiner*—Matthew J. Daniels
(74) *Attorney, Agent, or Firm*—Finnegan, Henderson, Farabow, Garrett & Dunner, L.L.P.

(57) ABSTRACT

An imprinting apparatus, for transferring a microstructure of a mold onto a forming material by pressing and mold-releasing, includes a plurality of driving devices which relatively move the mold the forming material to each other along an axis of a pressing direction, wherein the plurality of driving devices make different relative moving speeds of the mold and the forming material during the relative motion.

5 Claims, 9 Drawing Sheets

OTHER PUBLICATIONS

Bailey, T. et al. "Step and flash imprint lithography: Template surface treatment and defect analysis," *J. Vac. Sci. Technol. B* v.18(6), pp. 3572-3577 (Nov./Dec. 2000).

Bailey, T. et al. "Step and flash imprint lithography: Defect analysis," *J. Vac. Sci. Technol. B* v.19(6), pp. 2806-2810 (Nov./Dec. 2001).

Bailey, T.C. et al. "Template fabrication schemes for step and flash imprint lithography," *Microelectronic Engineering* v.61-62, pp. 461-467 (2002).

Cardinale, G.F. et al. "Fabrication of a surface acoustic wave-based correlator using step-and-flash imprint lithrography," *J. Vac. Sci. Technol. B* v.22(6), pp. 3265-3270 (Nov./Dec. 2004).

Choi, B.J. et al. "Design of Orientation Stages for Step and Flash Imprint Lithography," *Journal of Int. Societies for Precision Engineering and Nanotechnology* v.25(3), pp. 192-199 (Jul. 2001).

Choi, B.J. et al. "Layer-to-Layer Alignment for Step and Flash Imprint Lithography," *SPIE's 26th Intl. Symp. Microlithrography: Emerging Lithographic Technologies*, Mar. 2001.

Choi, B.J. et al. "Partially Constrained Complaint Stages for High Resolution Imprint Lithography," *Proceedings of ASME 2000 Design Engineering Technical Conference*, Sep. 2000.

Choi, J. et al. "Distortion and Overlay Performance of UV Step and Repeat Imprint Lithography," *MNE Micro- and Nano- Engineering Conference*, Sep. 2004.

Colburn, M. et al. "Characterization and modeling of volumetric and mechanical properties for step and flash imprint lithography photopolymers," *J. Vac. Sci. Technol. B* v.19(6), pp. 2685-2689 (Nov./Dec. 2001).

Colburn, M. et al. "Development and advantages of step-and-flash lithography," *Solid State Technology* (Jul. 2001).

Colburn, M. et al. "Step and Flash Imprint Lithography for sub-100 nm Patterning," *SPIE's 25th Intl. Symp. Microlithography: Emerging Lithographic Technologies III*. Mar. 3, 2000.

Colburn, M. et al. "Step and Flash Imprint Lithography: A New Approach to High-Resolution Patterning," *Proceedings of SPIE's 24th International Symposium on Microlithography: Emerging Lithographic Technologies III*, vol. 3676, Mar. 1999.

Dauksher, W.J. et al. "Characterization of and imprint results using indium tin oxide-based step and flash imprint lithography templates," *J. Vac. Sci. Technol. B*, vol. 20(6), pp. 2857-2861 (Nov./Dec. 2002).

Dauksher, W.J. et al. "Repair of step and flash imprint lithography templates," *J. Vac. Sci. Technol. B*, vol. 22(6), pp. 3306-3311 (Nov./Dec. 2004).

Dauksher, W.J. et al. "Step and flash imprint lithography template characterization, from an etch perspective," *J. Vac. Sci. Technol. B*, vol. 21(6), pp. 2771-2776 (Nov./Dec. 2003).

Doering, J. "An Enabling Technology for Nanoscale Manufacturing: Step and Flash Imprint Lithography (S-FIL™)," *NTSI Nano Impact Summit 2005*, Washington, D.C., Oct. 2005.

Falcon, M. et al. "Molecular Imprints: A Case Study on Success Through Strategic Industry and Academic Partnerships," *Nanotechnology Law and Business*, vol. 1.4, pp. 419-425 (2004).

Gehoski, K. et al. "Evaluation of the Imprio 100 Step and Flash Imprint Lithography Tool," Proceedings of the SPIE, vol. 5374, pp. 1006-1016 (2004), *reprinted from* http://www.molecularimprints.com/NewsEvents/techarticles.html.

Gehoski, K.A. et al. "Indium Tin Oxide Template Development for Step and Flash Imprint Lithography," *SPIE Microlithography Conference*, Feb. 2005.

Hershey, R. et al. "2D Photonic Crystal Patterning for High Volume LED Manufacturing," *SPIE Optics and Photonics manuscript*, Aug. 2006.

Hershey, R. et al. "Imprint Lithography Advances in LED Manufacturing," *6th International Symposium on Blue Laser and Light Emitting Diodes (ISBLLED 2006)*, Montpellier, France, May 2006.

Hess, H.F. et al. "Inspection of templates for imprint lithography," *J. Vac. Sci. Technol. B*, vol. 22(6), pp. 3300-3305 (Nov./Dec. 2004).

Johnson, S. et al. "Effects of etch barrier densification on step and flash imprint lithography," *J. Vac. Sci. Technol. B*, vol. 23(6), pp. 2553-2556 (Nov./Dec. 2005).

Johnson, S.C. et al. "Advances in Step and Flash Imprint Lithography," *SPIE Microlithography Conference*, Feb. 2003.

Le, N.V. et al. "Development of an Etch-definable Lift-off Process for Use with Step and Flash Imprint Lithography," *SPIE Microlithography Conference*, Feb. 2005.

Mancini, D. et al. "Analysis of critical dimension uniformity for step and flash imprint lithography," *SPIE Microlithography Conference*, Feb. 2003.

Mancini, D. et al. "Hydrogen silsesquioxane for direct electron-beam patterning of step and flash imprint lithography templates," *J. Vac. Sci. Technol. B* v.20(6), pp. 2896-2901 (Nov./Dec. 2002).

Mancini, D. et al. "Step and Flash Imprint Lithography for sub-80nm Contact Holes," *Solid State Technology*, vol. 47(2), (Feb. 2004).

Martin, C.J. et al. "Prediction of fabrication distortions in step and flash imprint lithography templates," *J. Vac. Sci. Technol. B*, vol. 20(6), pp. 2891-2895 (Nov./Dec. 2002).

McMackin, I. et al. "Design and Performance of a Step and Repeat Imprinting Machine" *SPIE Microlithography Conference*, Feb. 2003.

Miller, M. et al. "Fabrication of Nanometer Sized Features on Non-Flat Substrates Using a Nano-Imprint Lithography Process," *SPIE Microlithography Conference*, Feb. 2005.

Murthy, S. et al. "S-FIL™ Technology: Cost of Ownership Case Study," *SPIE Microlithography Conference*, Feb. 2005.

Myron, L.J. et al. "Advanced Mask Metrology Enabling Characterization of Imprint Lithography Templates," *SPIE Microlithography Conference*, Feb. 2005.

Myron, L.J. et al. "Defect Inspection for Imprint Lithography Using a Die to Database Electron Beam Verification System," *Proc. SPIE* 6151 (Aug. 2006), *reprinted from* http://www.molecularimprints.com/NewsEvents/techarticles.html.

Nordquist, K. et al. "Critical Dimension and Image Placement Issues for Step and Flash Imprint Lithography Templates," *22nd Annual BACUS Symposium on Photomask Technology*, Sept. 2002.

Nordquist, K.J. et al. "Image placement issues for ITC-based step and flash imprint lithography templates," *J. Vac. Sci. Technol. B*, vol. 22(2), pp. 695-701 (Mar./Apr. 2004).

Resnick, D. et al. "Release layers for contact and imprint lithography," *Semiconductor International*, pp. 71-80 (Jun. 2002).

Resnick, D. J. et al. "High resolution templates for step and flash imprint lithography" *J. Microlith., Microfab., Microsyst.*, vol. 1 No. 3, Oct. 2002.

Resnick, D. J. et al. "New Methods for Fabricating Step and Flash Imprint Lithography Templates," *NIST-SPIE Conference on Nanotechnology*, Sept. 2001.

Resnick, D.J. "Direct die-to-database electron beam inspection of fused silica imprint templates," *J. Vac. Sci. Technol. B*, vol. 24(6), pp. 2979-2983 (Nov./Dec. 2006).

Resnick, D.J. et al. "High Resolution Templates for Step and Flash Imprint Lithography," *SPIE Microlithography Conference*, Feb. 2002.

Resnick, D.J. et al. "Imprint lithography for integrated circuit fabrication," *J. Vac. Sci. Technol. B*, vol. 21(6), pp. 2624-2631 (Nov./Dec. 2003).

Resnick, D.J. et al. "Imprint Lithography: Lab Curiosity or the Real NGL?" *SPIE Microlithography Conference*, Feb. 2003.

Resnick, D.J. et al. "Initial study of the fabrication of step and flash imprint lithography templates for the printing of contact holes," *J. Microlith., Microfab., Microsyst.*, vol. 3(2), pp. 316-321 (Apr. 2004).

Resnick, D.J. et al. "Making an Imprint," *OE Magazine*, pp. 18-21 (Aug. 2003).

Resnick, D.J. et al. "Step & flash imprint lithography" *Materials Today*, vol. 8(2), pp. 34-42 (Feb. 2005).

Ruchhoeft, P. et al. "Patterning curved surfaces: Template generation by ion beam proximity lithography and relief transfer by step and flash imprint lithography," *J. Vac. Sci. Technol. B*, vol. 17(6), pp. 2965-2969 (Nov./Dec. 1999).

Schmid, G. et al. "Step and Flash Imprint Lithography Templates for the 32 nm Node and Beyond" *32nd International Conference on Micro- and Nano-Engineering*, Sep. 17-20, 2006, Barcelona, Spain, *reprinted from* http://www.molecularimprints.com/NewsEvents/techarticles.html.

Schmid, G.M. et al. "Implementation of an imprint damascene process for interconnect fabrication," *J. Vac. Sci. Technol. B*, col. 24(3), pp. 1283-1291 (May/Jun. 2006).

Smith, B.J. et al. "Employing Step and Flash Imprint Lithography for Gate Level Patterning of a MOSFET Device," *SPIE Microlithography Conference*, Feb. 2003.

Sreenivasan, S.V. et al. "Low-Cost Nanostructure Patterning Using Step and Flash Imprint Lithography," *NIST-SPIE Conference on Nanotechnology*, Sept. 2002.

Sreenivasan, S.V. et al. "Nanotechnology Small Print," *Small Print* (Apr. 2004), *reprinted from* http://www.molecularimprints.com/NewsEvents/techarticles.html.

Stewart, M. et al. "Direct Imprinting of Dielectric Materials for Dual Damascene Processing," *SPIE Microlithography Conference*, Feb. 2003.

Thompson, E. et al. "Fabrication of Step and Flash™ Imprint Lithography Templates Using Commercial Mask Processes," *SPIE Microlithography Conference*, Feb. 2003.

Wang, D. et al. "Advanced prototyping using step-and-flash imprint" *Solid State Technology*, vol. 48(12), pp. 60-62 (Dec. 2005).

Xu, F. et al. "Development of Imprint Materials for the Step and Flash Imprint Lithography Process," *SPIE Microlithography Conference*, Feb. 2004.

European Search Report dated Oct. 13, 2009, from the European Patent Office in corresponding EP Application No. 06 12 4007.

* cited by examiner

INVENTIVE EXAMPLE　　　COMPARATIVE EXAMPLE

DEFECT RATIO 0.3%　　　DEFECT RATIO 5%

IMPRINTING APPARATUS AND METHOD

This application is based on Japanese Patent Applications No. 2005-336844 filed on Nov. 22, 2005 and No. 2006-266238 filed on Sep. 29, 2006 in Japanese Patent Office, the entire content of which is hereby incorporated by reference.

FIELD OF THE INVENTION

The present invention relates to an imprinting apparatus and imprinting method that transfer a microstructure of a mold to a forming material.

BACKGROUND OF THE INVENTION

Imprinting methods are known which obtain a microstructure with micro protrusions by press-forming a resin, such as polystyrene, with a mold having a microstructure and then remove a formed product from the mold (for example, refer to Japanese Unexamined Patent Publication TOKKAI No. 2005-189128). FIG. 10 schematically shows a main part of an imprinting device in a prior art.

An imprinting device in a prior art, shown in FIG. 10, drives a pressing mechanical section 102 with a ball screw by a servomotor 101 to move a mold 103 fixed at the bottom edge downward, and presses the mold against a forming material 104 of a resin. A force sensor 106 is provided between a holding section 105 that holds the forming material 104 and a holding table 107. The force sensor 106 measures the pressing force, and a controller 109 controls the pressing force thorough servo control of the servomotor 101, based on a measurement signal amplified by an amplifier 108. After pressing, the controller 109 reverse-rotates the servo motor 101 to drive the pressing mechanism 102 so that the mold 103 moves upward for mold-releasing, and thus the mold 103 and forming material 104 are separated from each other.

In an imprinting device, as described above, although it is desirable to separate the mold 103 and the forming material 104 slowly for mold-releasing from a viewpoint of preventing generation of defects, the mold 103 is moved at a relatively high speed in consideration of productivity. Therefore, the pitch of the ball screw of the pressing mechanism 102 is designed to be large and the resolution angle of the servo motor 101 is designed to be large. That is, for the pressing mechanism 102, the minimum moving distance (unit) $\Delta Z$ is large, and the variation in force $\Delta F$ corresponding to $\Delta Z$ becomes large, $\Delta F$ being not smaller than 10 Newton, for example. Accordingly, an imprinting device in a prior art is incapable of slowly separating the mold 103 and forming material 104 from each other for mold-releasing, which tends to easily cause defects. On the other hand, with a shorter pitch of the ball screw of the pressing mechanism 102 and a smaller resolution angle of the servo motor 101, the time required for pressing becomes longer, lowering the productivity of the imprinting device.

To solve problems, as described above, with prior arts, an object of the present invention is to provide an imprinting apparatus and method which enable mold-releasing operation that minimizes generation of defects, while maintaining the productivity.

SUMMARY OF THE INVENTION

In an aspect of the invention, there is provided
an imprinting apparatus for transferring a microstructure of a mold onto a forming material by pressing and mold-releasing, including:

a plurality of driving devices which relatively move the mold and the forming material to each other along an axis of a pressing direction, wherein the plurality of driving devices make different relative moving speeds of the mold and the forming material during the relative motion.

In another aspect of the invention, there is provided
an imprinting method that transfers a micro structure of a mold onto a forming material, including:

a pressing step; and a mold-releasing step, wherein the method uses a plurality of driving devices that relatively move the mold and forming material to each other along an axis of a pressing direction at different relative moving speeds during the relative motion.

In still another aspect of the invention, there is provided
an imprinting method, including:

a temperature raising process for raising a temperature of a mold;

a pressing process for pressing by relatively moving the mold and forming material at a first relative moving speed;

a maintaining process for maintaining a force by the pressing for a predetermined time;

a cooling process for cooling the mold; and a mold-releasing process for separating the mold and the forming material by relatively moving the mold and the forming material at a second relative moving speed, wherein the method executes the pressing process and the mold-releasing process with different driving devices such that the second relative moving speed in the mold-releasing process is lower than the first relative moving speed in the pressing process.

BRIEF DESCRIPTION OF THE DRAWINGS

FIG. 7b is a schematic diagram showing a modified example of the disposition of the press-driving device and mold-release driving device of the imprinting apparatus in FIG. 7a;

FIG. 7c is a schematic diagram showing another modified example of the disposition of the press-driving device and mold-release driving device of the imprinting apparatus in FIG. 7a;

DETAILED DESCRIPTION OF THE PREFERRED EMBODIMENT

Figure 1:
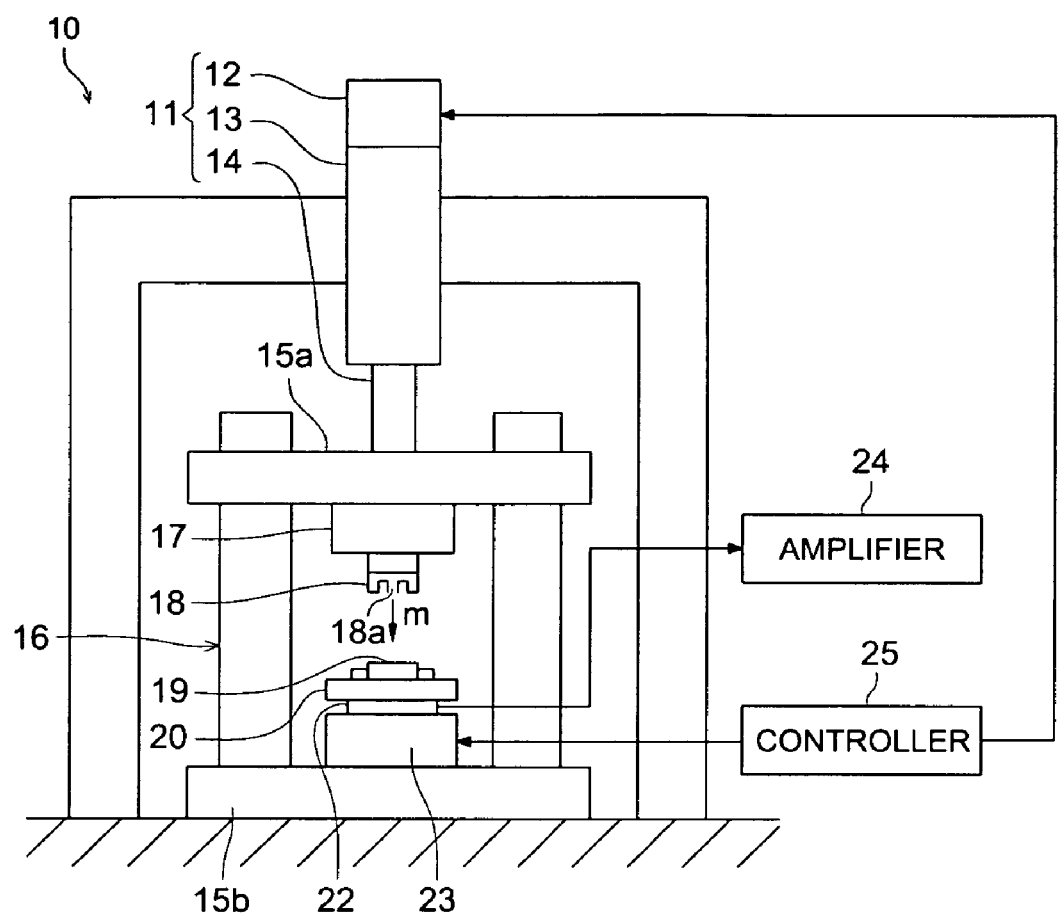
FIG. 1 is a schematic diagram showing a main part of an imprinting apparatus in an embodiment.

Preferred embodiment in accordance with the present invention will be described below, referring to the drawings. FIG. 1 is a schematic diagram showing a main part of an imprinting apparatus in accordance with the present embodiment.

As shown in FIG. 1, an imprinting apparatus 10 in the present embodiment includes a press-driving device 11 for imprinting press, support section 17 to support and fix a mold 18 having a micro periodical relief structure 18*a*, holding section 20 to hold and fix a forming material 19 of a resin or the like that relatively approaches the mold 18 and is subjected to forming, mold-release driving device 23 to drive the holding section 20 at the time of mold-releasing, force sensor 22 disposed between the holding section 20 and mold-release driving device 23 to detect a forces applied to the forming material 19, amplifier 24 to amplify a detection signal from the force sensor 22, and controller 25 to perform feedback-control of the mold-release driving device 23 based on the amplified detection signal from the amplifier 24.

The press-driving device 11 includes a servo motor 12, press-mechanism 13 to perform pressing by conversion of rotational motion of the servo motor 12 into linear motion with a ball screw, and driving rod 14 to drive the support section 17 connected with the press-mechanism 13 up and down. The press-driving device 11 makes the mold 18 and forming material 19 relatively approach to each other and performs pressing. Herein, the mold 18 and forming material 19 are pressed against each other, following the relative approach. That is, the mold 18 is moved to the forming material 19 and comes in contact with it in the present embodiment. However, the relative approach is not limited thereto. The forming material 19 may be moved to the mold 18, or both the mold 18 and forming material 19 may be moved to each other to come in contact with each other.

The imprinting apparatus 10 includes a horizontal member 15*a* that supports the support section 17 movably up and down, horizontal table 15*b* that supports and fixes the mold-release driving device 23, and vertical member 16 that is fixed to the horizontal table 15*b* and supports the horizontal member 15*a*. Further, the imprinting apparatus 10 includes a heater (not shown) in the support section 17, as a heating means for heating the mold 18, and raises the temperature of the mold 18 to a predetermined temperature for pressing.

Figure 2:
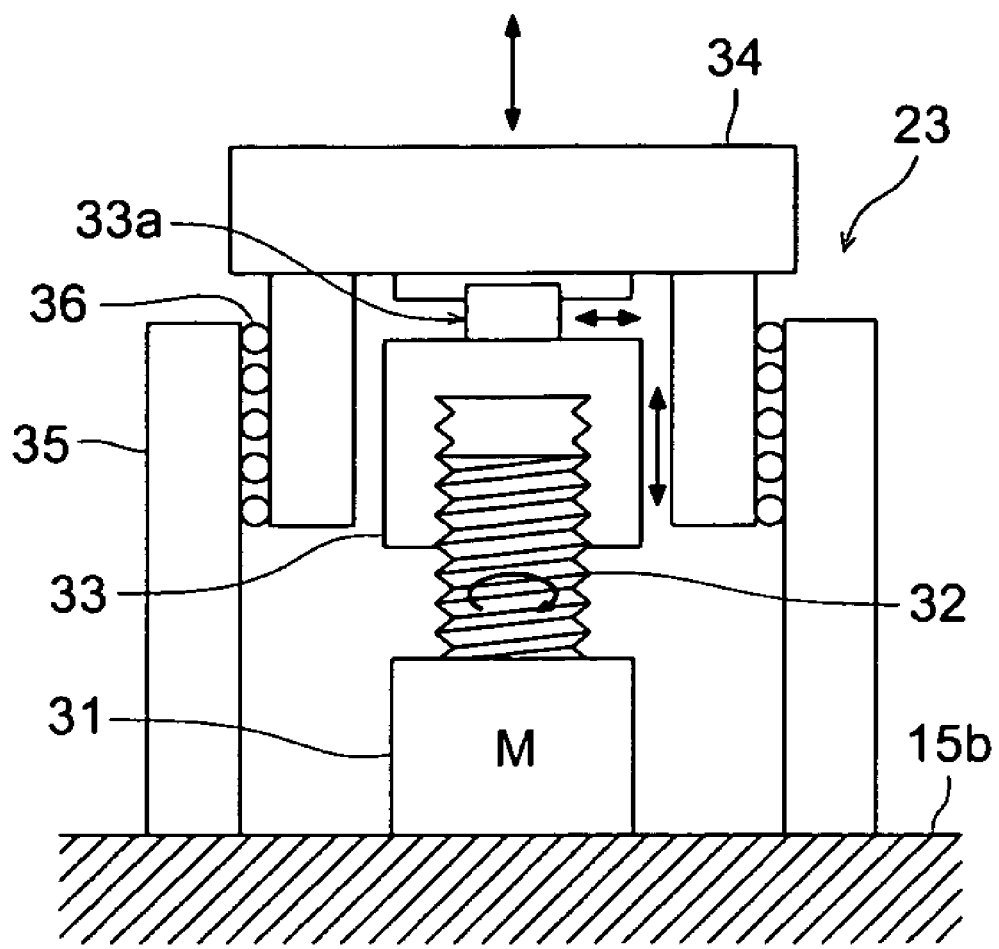
FIG. 2 is a schematic diagram showing an example of a structure of a mold-release driving device 23 in FIG. 1.

FIG. 2 schematically shows an example of a structure of the mold-release driving device 23 in FIG. 1. The mold-release driving device 23 includes a servo motor 31, ball screw rotation shaft 32 that is connected to the servo motor 31 and rotationally driven, linearly moving section 33 that gears with the ball screw rotation shaft 32 and converts the rotational motion of the ball screw shaft 32 into a linear motion up and down in the figure, driving table 34 driven by the linearly moving section 33 through a linear motion bearing 33*a*, and a support member 35 that is fixed on the horizontal table 15*b*, shown in FIG. 1, to support the driving table 34 through the linear motion bearing 36. The force sensor 22, shown in FIG. 1, is disposed on the driving table 34. In FIG. 2, the linear motion bearing 36 horizontally restrains the driving table 34, and the other linear motion bearing 33*a* absorbs horizontal motion error of the ball screw rotation shaft 32. Therefore, only the vertical forces of the servo motor 31 and ball screw rotation shaft 32 are transmitted to the driving table 34 to move the driving table 34 up and down.

The servo motor 31 of the mold-release driving device 23, in FIG. 2, has a smaller resolution angle than that of the servo motor 12 of the press-driving device 11, in FIG. 1, and the ball screw rotation shaft 32 has a smaller pitch than that of the ball screw of the press-mechanism section 13. In such a manner, the mold-release driving device 23 has a micromotion mechanism with a fine driving resolution. The controller 25 controls the rotation speed of the servo motor 31, based on a detection signal from the force sensor 22, to move the forming material 19 on the driving table 34 along the axis of the pressing direction m with a smaller pitch than that of the press-driving device 11 so that the forming material 19 is removed from the mold 18 at a relatively low speed (for example, several μm/sec). Meantime, the forming material 19 is fixed to the holding section 20, mechanically, with vacuum absorption, with a two-sided tape, or the like. In the present embodiment, chucks are employed to fix the forming material 19 to the holding section 20.

On the other hand, the press-driving device 11, in FIG. 1, has a coarse driving resolution, and is capable of moving the mold 18 along the axis of the pressing direction m with a relatively large pitch by the servo motor 12 and press-mechanism 13 so that the mold 18 approaches the forming material 19 at a relatively high speed.

In the imprinting apparatus 10, in FIGS. 1 and 2, the press-driving device 11 performs pressing such that the mold 18 approaches the forming material 19 in a relatively short time, and then the mold-release driving device 23 removes the forming material 19 from the mold 18, taking a relatively long time.

Now, a forming process from S01 to S06 by the imprinting device 10, in FIGS. 1 and 2, will be described, referring to the flowchart in FIG. 3.

The mold 18, in FIG. 1, is heated by flowing a current through the heater in the support section 17 to a predetermined temperature (S01), and then the servo motor 12 of the press-driving device 11 is rotationally driven so that the press-mechanism 13 moves a driving rod 14 in the pressing direction 'm' downward fast in a relatively short time, thus the mold 18 approaching the forming material 19 (S02).

Then, the mold 18 is pressed against the forming material 19 (S03), maintained at a predetermined pressing force for a predetermined time (S04), and cooled (S05).

In step S03, the pressing force applied to the forming material 19 is detected with a force sensor and the detected force is amplified to be a detection signal, based on which the press driving device is feedback controlled. Or, the relative distance between the mold 18 and forming material 19 may be measured and represented by a signal (for example, the rotation amount of the servo motor 12), based on which the press driving device is feedback controlled. In the present embodiment, the above stated force sensor 22 and amplifier 24 for feedback control of the mold-release driving device 23 are also used as the force sensor and amplifier for feedback control of the press driving mechanism 11. However, it is also possible to provide another force sensor and amplifier.

Next, the servo motor 31 of the mold-release driving device 23, in FIG. 2, is rotationally driven, the forming material 19, shown in FIG. 1, is moved downward by the ball screw rotation shaft 32 through the linear motion section 33 and driving table 34 in a relatively long time to be separated from the mold 18 (S06). Thus, the micro periodical relief structure 18*a* of the mold 18 is transferred to the forming material 19.

An adhesive force that resists mold-releasing (hereinafter, also referred to merely as an adhesive resistant force) is caused between the mold 18 and forming material 19 upon the mold-releasing. Herein, mold-releasing can be performed, restricting the adhesive resistant force to be not greater than a predetermined value, by removing the forming material 19 from the mold 18 slowly at a low moving speed of several μm/sec, for example, with the mold-release driving device 23 while detecting the adhesive resistant force with the force sensor 22. In such a manner, a great adhesive resistant force is not caused between the mold 18 and forming material 19 at the mold-releasing. Accordingly, it is possible to inhibit and minimize the generation of defects on the forming surface of the forming material 19 onto which the micro periodical relief structure 18*a* has been transferred.

As described above, the imprinting apparatus 10 in FIGS. 1 and 2 includes a plurality of driving devices 11 and 23 having different minimum driving resolutions. Thus, the imprinting apparatus 10 is capable of performing fast transportation and pressing in a relatively short time with the press-driving device 11 having a coarse resolution, and performing slow mold-releasing in a relatively long time with the mold-release driving device 23 with a fine resolution. In such a manner, it is possible to perform mold-releasing operation that inhibits and minimizes the generation of defects while maintaining productivity.

Particularly, the larger the aspect ratio with a smaller pitch and higher protrusion of a micro periodical relief structure 18*a* of a mold 18, the larger the adhesive resistant force between the forming material 19 and micro periodical relief structure 18*a* and the more difficult the mold-releasing, when the resin for the forming material 19 is filled to the micro periodical relief structure 18*a* in pressing. Consequently, generation of defects, such as a chip or break, in the filled resin easily occur if the mold 18 and forming material 19 are separated from each other at a higher speed in mold-releasing, and accordingly the defect area ratio has been reduced at most to about 5% with a device in a prior art. On the other hand, the imprinting apparatus 10 in the present embodiment can carry out mold-releasing, taking a relatively long time, thereby inhibiting and minimizing generation of defects, such as above stated breaks and chips.

Next, three modification examples of micromotion mechanisms of the mold-release driving device 23 in FIG. 2 will be described, referring to FIGS. 4, 5 and 6. Parts different from those in FIG. 2 will be focused in the following description.

Figure 4:
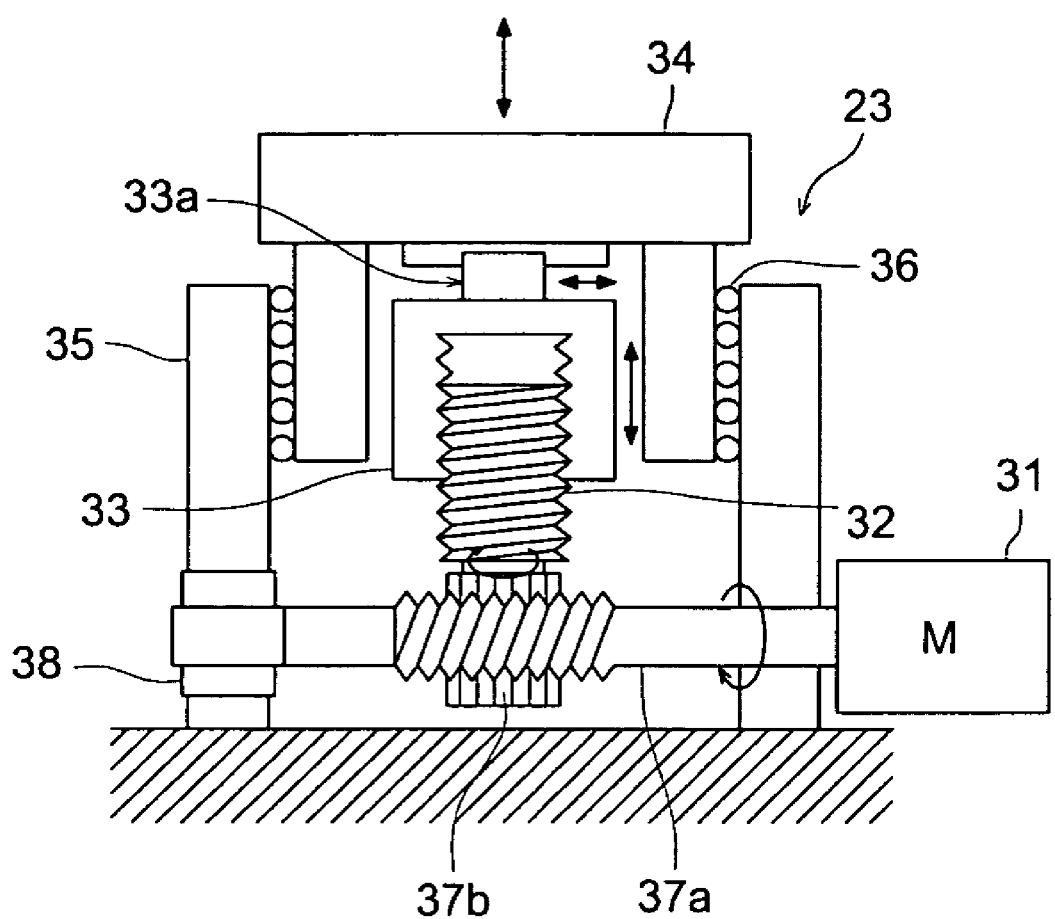
FIG. 4 is a schematic diagram showing a modified example of a micromotion mechanism of the mold-release driving device 23 in FIG. 2.

In the example in FIG. 4, a cylindrical warm gear 37*a*, which is rotatably supported by a bearing 38 of a support member 35 and extending horizontally, rotates a wheel 37*b* with the rotation of a servo motor 31, and thus a ball screw rotation shaft 32 rotates and a linear moving section 33 moves linearly.

Figure 5:
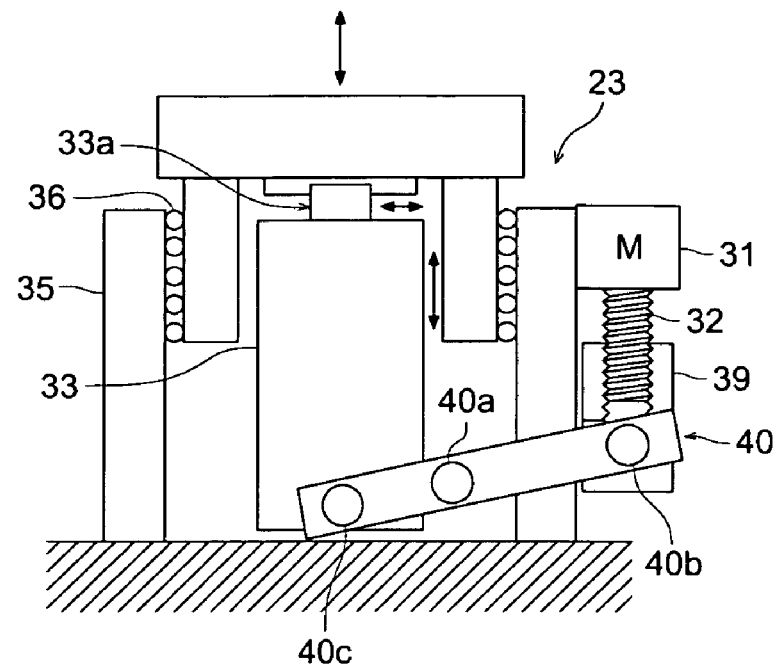
FIG. 5 is a schematic diagram showing another modified example of a micromotion mechanism of the mold-release driving device 23 in FIG. 2.

In an example in FIG. 5, rotation of a servo motor 31 is converted into linear motion through a ball screw rotation shaft 32 and a second linear moving section 39. The second linear moving section 39 lifts, for example, a lever member 40 with a bearing 40*b* at one end, by which the lever member 40 rotates around a bearing 40*a* being a fulcrum, and thus the other end of the lever member 40 moves a first linear moving section 33 downward with a bearing 40*c*.

Figure 6:
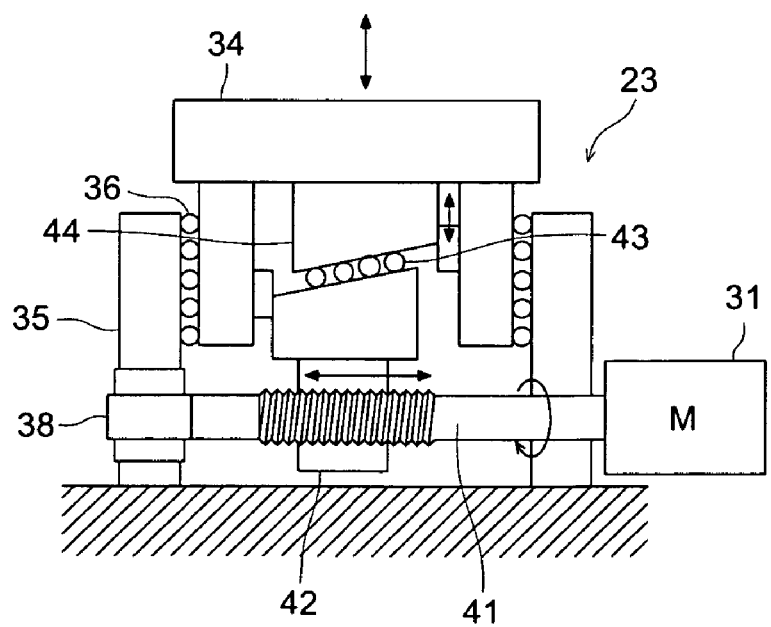
FIG. 6 is a schematic diagram showing still another modified example of a micromotion mechanism of the mold-release driving device 23 in FIG. 2.

In an example in FIG. 6, a first wedge member 42 having an inclined top surface and a second wedge member 44 having an inclined bottom surface facing the first wedge member 42 through a roller bearing 43 construct a linear moving section. A ball screw rotation shaft 41 horizontally penetrating through the first wedge member 42 is rotated by a servo motor 31, by which the first wedge member 42 horizontally and linearly moves and accordingly the second wedge member 44 moves up and down in the figure.

According to the micro mechanisms in FIGS. 4 to 6, a micro mechanism similar to that of the mold-release driving device 23 in FIG. 2 can be arranged, wherein it is possible to set the pitch of the ball screw to be small and separate the forming material 19 from the mold 18 at a relatively slow speed for mold-releasing, the same as in the case in FIGS. 1 and 2.

Next, a modified example of the disposition of a press driving device and mold-release driving device of the imprinting apparatus in the present embodiment will be described, referring to FIG. 7.

Figure 7A:
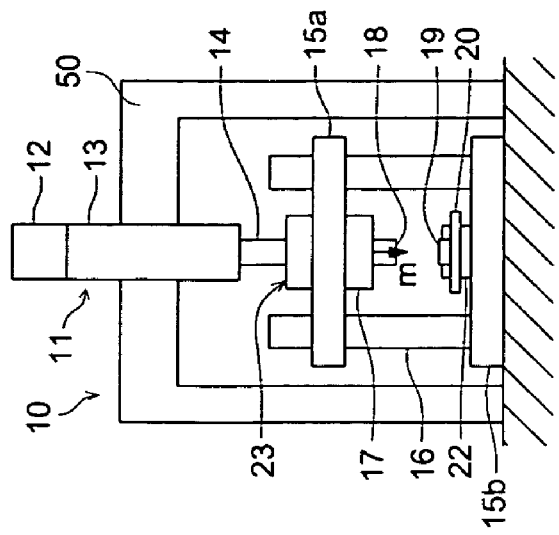
FIG. 7a is a diagram showing the imprinting apparatus with a support member 50, same as shown in FIG. 1.

FIG. 7*a* shows an imprinting apparatus 10, the same as the apparatus in FIG. 1, provided with a support member 50, surrounding the horizontal member 15*a*, horizontal table 15*b*, and vertical member 16. The support member 50 supports the press-mechanism section 13 of the press driving device 11.

Figure 7B:
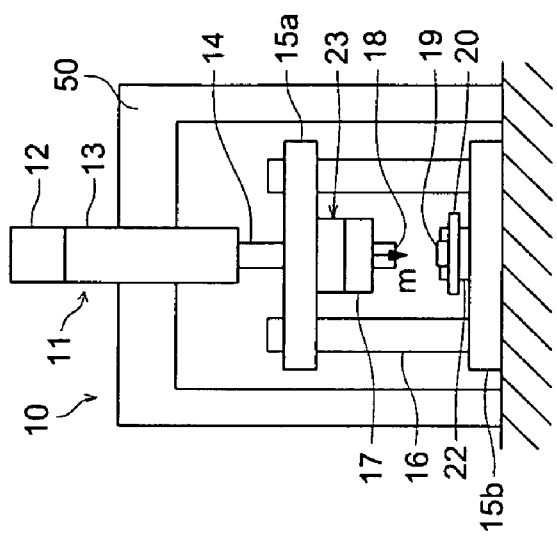

In an example of disposition in FIG. 7*b*, the mold-release driving device 23 in FIG. 7*a* is provided in an upper position between the horizontal member 15*a* and support section 17. The force sensor 22 is disposed between the holding section 20 of the forming material 19 and the horizontal table 15*b*. With the disposition in FIG. 7*b*, similarly to the case in FIGS. 1 and 2, the press driving device 11 carries out quick transportation and pressing in a relatively short time. In subsequent mold-releasing, while the force sensor 22 measures the adhesive resistant force between the forming material 19 and mold 18 until the mold 18 is completely separated from the forming material 19, the mold-release driving device 23 carries out mold-releasing, taking a relatively long time.

Figure 7C:
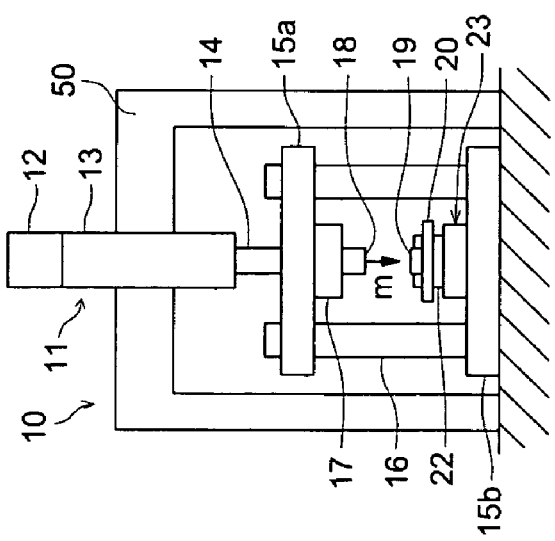

In an example of disposition in FIG. 7*c*, the mold-release driving device 23 is provided at an upper position, similarly to the case in FIG. 7*b*. However, the mold-release driving device 23 is disposed between a driving rod 14 and horizontal member 15*a*. The force sensor 22 is disposed between the holding section 20 of the forming material 19 and the horizontal table 15*b*. With the disposition shown in FIG. 7*c*, similarly to the case in FIGS. 1 and 2, the press driving device 11 carries out quick transportation and pressing in a relatively short time. In subsequent mold-releasing, while the force sensor 22 measures the adhesive resistant force between the forming material 19 and mold 18 until the mold 18 is completely separated from the forming material 19, the mold-release driving device 23 carries out mold-releasing, taking a relatively long time.

INVENTIVE EXAMPLE

The present invention will be described in further detail below, referring to an inventive example. However, the invention is not limited thereto.

A mold was formed with a repeated pattern of micro relief structures (1300 nm in depth and 350 nm in pitch) in a circular area with a diameter of 4 mm at the center of a silicon base material with a thickness of 0.5 mm. A resin sheet with a thickness of 188 μm of a transparent resin (ARTON (registered trademark) by JSR Corporation) was employed as the forming material, and the mold temperature was set to 210° C.

Figure 3:
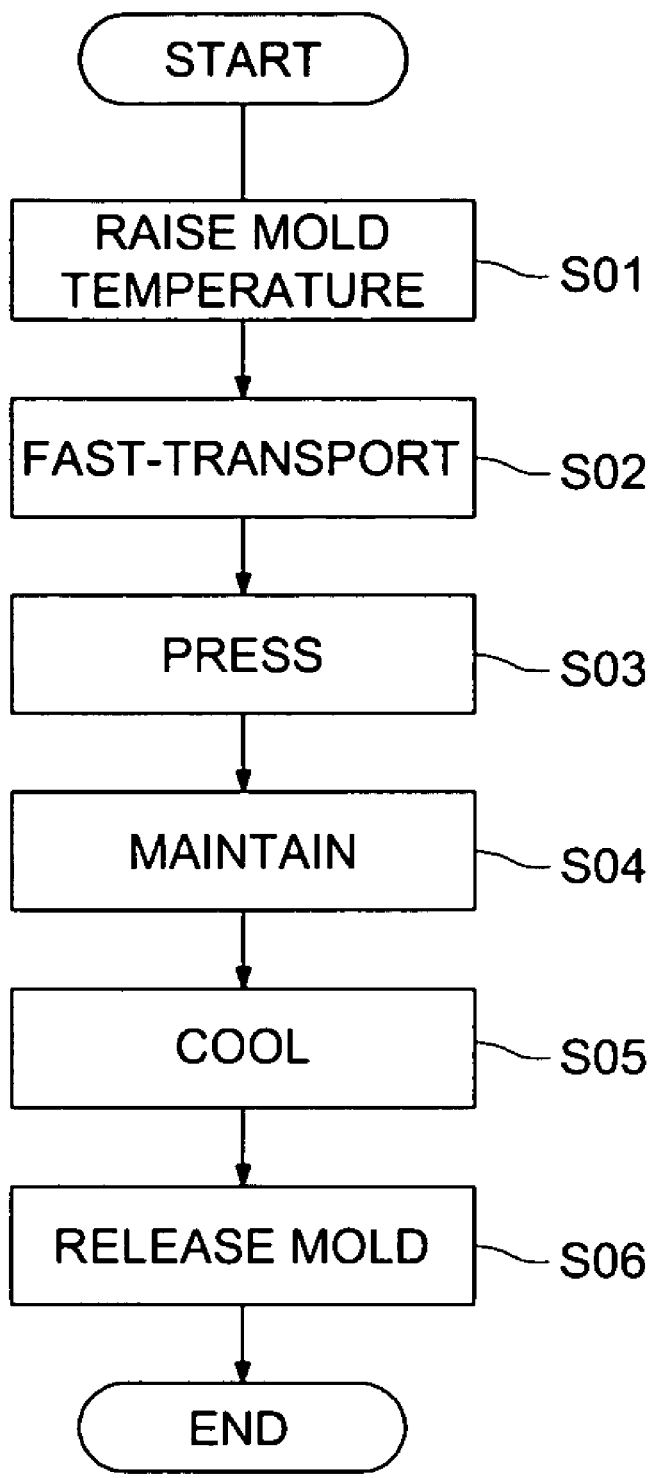
FIG. 3 is a flowchart describing a forming process from S01 to S06 by the imprinting apparatus 10 in FIGS. 1 and 2.

Using an imprinting apparatus similar to one, shown in FIGS. 1 and 2, (i) the mold temperature was raised to 210° C., (ii) the press driving device fast transported, namely moved, the mold with a minimum transportation resolution of 10 μm, at the transportation speed of the mold 10 mm/sec, (iii) a pressing force of 400 N (approximate pressure of 4 MPa) was applied, (iv) the pressing state with pressing force, described above, was maintained for 2 seconds to perform forming, (v) the mold was cooled down to 100° C., and (vi) then the mold was released (see FIG. 3).

In above step (ii) for fast transportation, transportation is preferably divided into two steps in the fast transportation process, in order to shorten the time required for transportation. For example, the transportation speed is initially set to a faster speed of 20 mm/second, and when the mold and forming material get closer to each other, the transporting speed is decelerated. In such a manner, high productivity can be maintained.

In above step (Vi) for mold-releasing, by synthesizing the resolution angle of the servo motor and the pitch of the ball screw of the mold-release driving device, the minimum transportation resolution of the micromotion mechanism was set to 0.01 μm and the minimum transportation speed by the micromotion mechanism was set to 0.2 μm/sec.

For a comparative example, the same imprinting apparatus with the inventive example was used to perform forming and mold-releasing under the same conditions as the inventive example except that pressing and mold-releasing were carried out only with the press driving device without operating the mold-release driving device. The actual mold-releasing speed was set to be in a range 5 μm/second to 1 mm/second (variable) with the micromotion mechanism of the mold-release driving device in the inventive example, and set to 10 mm/second (fixed) with the press driving device in the comparative example.

Figure 8:
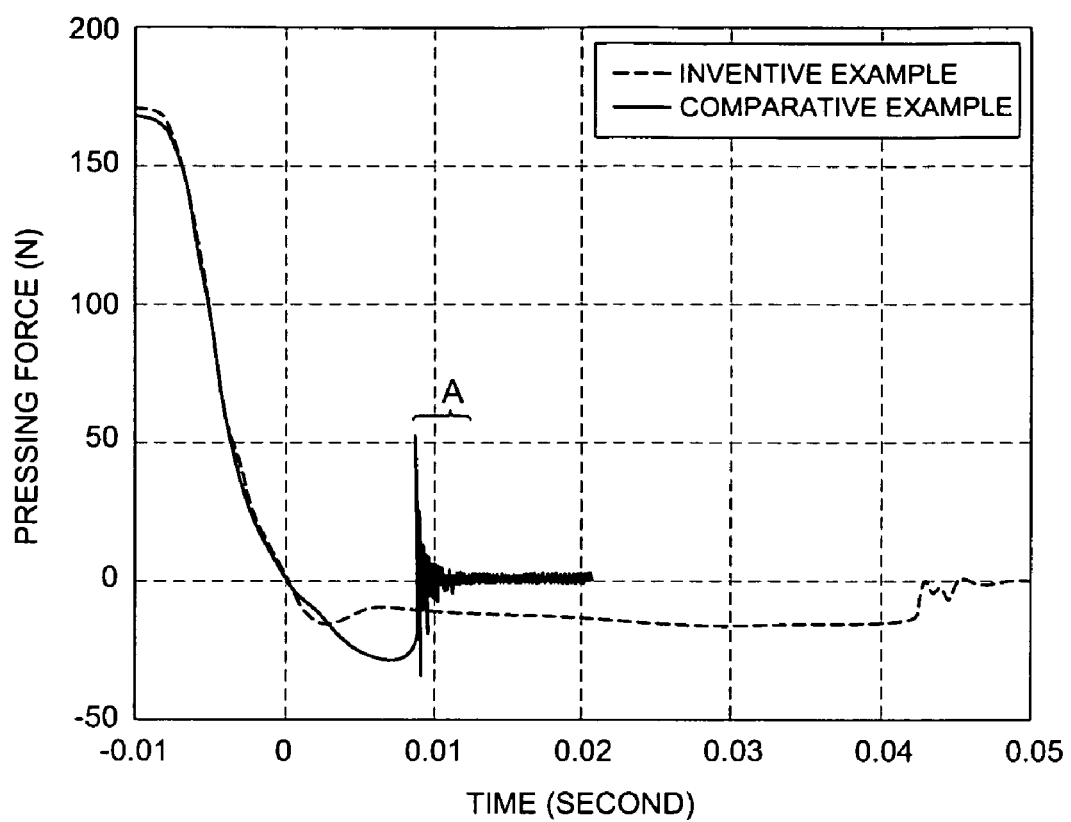
FIG. 8 is a diagram showing data obtained by measuring the temporal change in the pressing force with a force sensor at the time of mold-releasing in an inventive example and comparative example.

FIG. 8 shows data of the temporal change in pressing force during mold-releasing measured with a force sensor, for the inventive example and comparative example. The time required for mold-releasing was approximately 0.045 sec for the inventive example, and approximately 0.008 sec for the comparative example. As shown in FIG. 8, after starting mold-releasing, the pressing force (compressive force) decreased in almost the same profile in the inventive example and comparative example. When the pressing force became down to zero or below, an adhesive resistant force (tension force) occurred between the mold and the forming material. Herein, in the comparative example, since the minimum transportation resolution of the press driving device is coarse and the transportation speed is high, it is proved that the tension force is accumulated greatly, the force is released in a short time, and this shock causes resonance of the force sensor in the time range A in the figure. It is understood that the micro relief structure having been transferred to the resin sheet is broken at the moment of the release of the accumulated force. On the other hand, in the inventive example, since the minimum transportation resolution of the mold-release driving device is fine and the transportation speed is low, it is proved that mold-releasing proceeds more slowly than in the comparative example, and accordingly, mold-releasing is completed wherein the tension force is not greatly accumulated. Therefore, it is understood that the micro relief structure having been transferred to the resin sheet is break-proof.

Figure 9A:
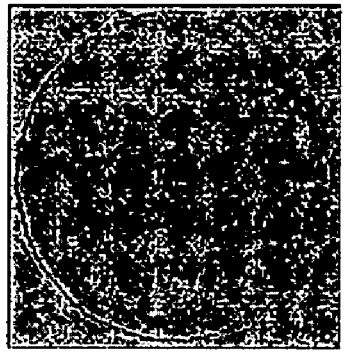
FIGS. 9*a* and 9*b* are diagrams showing a photograph of a circular surface (with a diameter of 4 mm) transferred to a resin sheet in the inventive example and in the comparative example respectively.
Figure 9B:
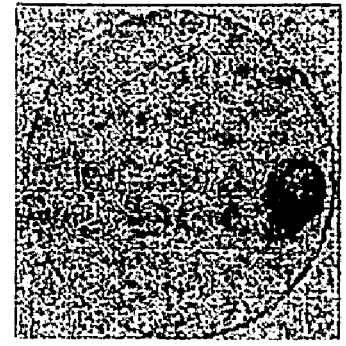
Figure 10:
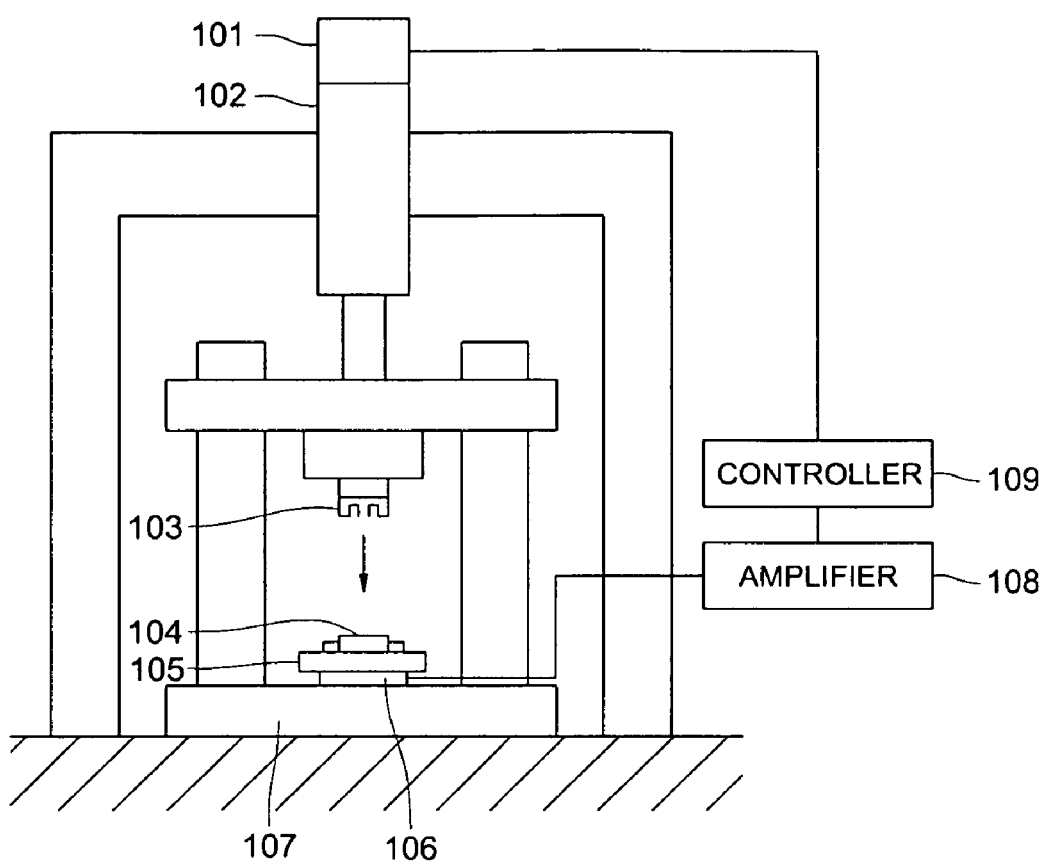
FIG. 10 is a schematic diagram showing a main part of an imprinting apparatus in a prior art.

FIGS. 9A and 9B show respective pictures of circular transfer surfaces (4 mm in diameter) transferred to the resin sheets in the inventive and comparative examples. It is proved that the defect ratio was 5% in area conversion in the comparative example, as shown in FIG. 9B. In the inventive example, the defect ratio was greatly improved down to 0.3%, as shown in FIG. 9A.

With an imprinting apparatus or imprinting method in accordance with the present invention, different moving speeds can be set for pressing and mold-releasing with plural driving devices so as to perform pressing in a shorter time and mold-releasing in a longer time. Thus, it is possible to perform pressing quickly and mold-releasing slowly, thereby achieving mold-releasing operation that minimizes defect generation while maintaining productivity.

Although a preferred embodiment of the present invention has been described above, the invention is not limited thereto, and it is understood that various modification can be made without departing from the sprit and scope of the present invention. For example, for the imprinting apparatus in the present embodiment, a thermal imprinting method was employed, however the invention is not limited thereto, and a UV printing method that uses a UV curable resin can also be applied.

What is claimed is:

1. An imprinting method that transfers a micro structure of a mold onto a forming material, comprising:
   a pressing step including,
      a temperature raising process for raising a temperature of the mold;
      a pressing process for pressing by moving the mold and forming material relative to one another at a first relative moving speed;
      a maintaining process for maintaining a force applied by the pressing step for a predetermined time; and
      a cooling process for cooling the mold; and
   a mold-releasing step including,
      a mold-releasing process for separating the mold and the forming material by relatively moving the mold and the forming material at a second relative moving speed;
   wherein a plurality of driving devices are configured to move the mold and the forming material relative to each other along an axis of a pressing direction, said plurality of driving devices including a driving device for pressing and a driving device for mold-releasing;
   wherein the pressing process is executed by the driving device for pressing and the mold-releasing process is executed by the driving device for mold-releasing, such that said second relative moving speed is lower than said first relative moving speed; and
   wherein the second relative moving speed is controlled in response to a signal from a force detection sensor in communication with said driving device for mold-releasing, said signal corresponding to a force applied to the forming material during the mold releasing step and detected by the force detecting sensor.

2. The imprinting method of claim 1, wherein said plurality of driving devices have, along said axis of a pressing direction, a transportation resolution for pressing and a transportation resolution for mold-releasing, wherein said transportation resolution for pressing and transportation resolution for mold-releasing differ from one another.

3. The imprinting method of claim 1, wherein said second relative moving speed is variable.

4. The imprinting method of claim 1, wherein the force applied to the forming material during the mold-releasing step is caused by an adhesive force between the mold and the forming material after the pressing step, and occurs along said pressing direction.

5. The imprinting method of claim 1, wherein the pressing step further comprises a fast transportation process, between the temperature raising process and the pressing process, that moves the mold and the forming material at a third relative moving speed,
   wherein the third relative moving speed is higher than or equal to the first relative moving speed.

* * * * *